United States Patent
Watanabe (10) Patent No.: US 8,041,523 B2
(45) Date of Patent: Oct. 18, 2011

(54) BATTERY CHARGE/DISCHARGE CURRENT DETECTION APPARATUS

(75) Inventor: Hidemitsu Watanabe, Kariya (JP)

(73) Assignee: Denso Corporation, Kariya (JP)

(*) Notice: Subject to any disclaimer, the term of this patent is extended or adjusted under 35 U.S.C. 154(b) by 427 days.

(21) Appl. No.: 12/285,454

(22) Filed: Oct. 6, 2008

(65) Prior Publication Data
US 2009/0132188 A1 May 21, 2009

(30) Foreign Application Priority Data
Nov. 19, 2007 (JP) .................................. 2007-298810

(51) Int. Cl.
G01R 19/00 (2006.01)
G06F 11/30 (2006.01)

(52) U.S. Cl. ............. 702/64; 702/63; 702/182; 702/183

(58) Field of Classification Search ............. 702/63–65, 702/104–107, 188
See application file for complete search history.

(56) References Cited

U.S. PATENT DOCUMENTS

| | | | |
|---|---|---|---|
| 5,489,834 A | 2/1996 | Pitkanen | |
| 5,545,969 A | 8/1996 | Hasegawa | |
| 5,998,968 A * | 12/1999 | Pittman et al. ................. | 320/130 |
| 6,140,928 A * | 10/2000 | Shibuya et al. ........... | 340/636.13 |
| 6,437,574 B1 * | 8/2002 | Robinson et al. .............. | 324/426 |
| 2002/0008523 A1 * | 1/2002 | Klang ........................... | 324/429 |
| 2003/0155930 A1 * | 8/2003 | Thomsen ....................... | 324/522 |
| 2008/0315686 A1 * | 12/2008 | Elder et al. ...................... | 307/66 |

FOREIGN PATENT DOCUMENTS

| | | |
|---|---|---|
| JP | A-6-94811 | 4/1994 |
| JP | A-6-176798 | 6/1994 |
| JP | A-2000-194456 | 7/2000 |

OTHER PUBLICATIONS

Decision of Rejection for Corresponding Japanese Application No. 2007-298810, mailed on Jul. 16, 2010 (w/ English translation).
Notification of Reasons for Rejection for Japanese Application No. 2007-298810; issued on Nov. 24, 2009 (w/ English translation).

* cited by examiner

*Primary Examiner* — Andrew Schechter
*Assistant Examiner* — Phuong Huynh
(74) *Attorney, Agent, or Firm* — Oliff & Berridge, PLC (57) ABSTRACT

The battery charge/discharge current detection apparatus has a power supply circuit powered by a battery mounted on a vehicle and configured to detect a charge/discharge current of the battery by use of a current detecting resistor connected between a negative terminal of the battery and a ground. The battery charge/discharge current detection apparatus includes a first function of detecting a voltage across the voltage detecting resistor, a second function of detecting a charge/discharge current of the battery on the basis of the voltage detected by the first function, a third function of detecting presence of an abnormality of the current detecting resistor, and a fourth function of informing an abnormality detected by the third function to the outside. The battery-side negative terminal of the power supply circuit is connected to the negative terminal of the battery.

2 Claims, 6 Drawing Sheets

AUTOMATIC GROUND SWITCHING SECTION

FIG. 8

BATTERY CHARGE/DISCHARGE CURRENT DETECTION APPARATUS

CROSS-REFERENCE TO RELATED APPLICATION

This application is related to Japanese Patent Application No. 2007-298810 filed on Nov. 19, 2007, the contents of which are hereby incorporated by reference.

BACKGROUND OF THE INVENTION

1. Field of the Invention

The present invention relates to a battery charge/discharge current detection apparatus for detecting a charge/discharge current of a battery mounted on a vehicle such as a passenger car or a truck.

2. Description of Related Art

There is known a remaining-battery-capacity indicating apparatus configured to detect a charge/discharge current of a battery on the basis of a voltage across a current detecting resistor connected between the negative terminal of the battery and the ground. For example, refer to Japanese Patent Application laid-open No. 6-176798. In this remaining-battery-capacity indicating apparatus, the remaining capacity of the battery is calculated by integrating the detected charge/discharge current.

In recent years, there is tendency that the number of electrical loads mounted on a vehicle which consume large power while the vehicle is moving (an electric power steering and a brake, for example) increases with development of vehicle electronization. Accordingly, there have been cases where a large current flows while the vehicle is moving, posing the following problems when the charge/discharge current of a battery is detected by use of a current detecting resistor.

(1) Since a vehicle body is used as the ground, the voltage of the ground varies depending on a current flowing through the vehicle body, causing a power supply voltage of the remaining-battery-capacity indicating apparatus to fluctuate to thereby lower the current detecting accuracy. In addition, if the temperature of the current detecting resistor excessively rises due to a current flowing therethrough, the current detecting accuracy is further lowered due to temperature drift of the resistance thereof.

(2) If the resistance of the current detecting resistor increases due to deterioration thereof, the voltage across its ends increases, and its temperature may excessively rise. The driver of the vehicle on which the remaining-battery-capacity indicating apparatus is mounted cannot notice such an abnormal condition until malfunction resulting from the abnormal condition occurs if a specific means for detecting such a condition is not provided. Furthermore, since it is not easy in many cases to find whether or not the malfunction occurred is due to inaccurate detection of the charge/discharge current of the battery, it is difficult to take quickly an appropriate measure, for example, to make repairs, or replacement. For example, when the current detecting resistor is blown, if no repairs or replacement are made, it becomes impossible to restart a vehicle engine by a starter, because the starter cannot be supplied with electric power from the battery after the engine is stopped.

SUMMARY OF THE INVENTION

The present invention provides a battery charge/discharge current detection apparatus having a power supply circuit powered by a battery mounted on a vehicle and configured to detect a charge/discharge current of the battery by use of a current detecting resistor connected between a negative terminal of the battery and a ground, the battery charge/discharge current detection apparatus comprising:

a first function of detecting a voltage across the voltage detecting resistor;

a second function of detecting a charge/discharge current of the battery on the basis of the voltage detected by the first function;

a third function of detecting presence of an abnormality of the current detecting resistor; and a fourth function of informing an abnormality detected by the third function to the outside;

wherein a battery-side negative terminal of the power supply circuit is connected to the negative terminal of the battery.

According to the present invention, it is possible to provide an apparatus capable of accurately detecting a charge/discharge current of a vehicle battery, and reliably detecting presence of an abnormality of a current detecting resistor connected thereto.

Other advantages and features of the invention will become apparent from the following description including the drawings and claims.

PREFERRED EMBODIMENTS OF THE INVENTION

Figure 1:
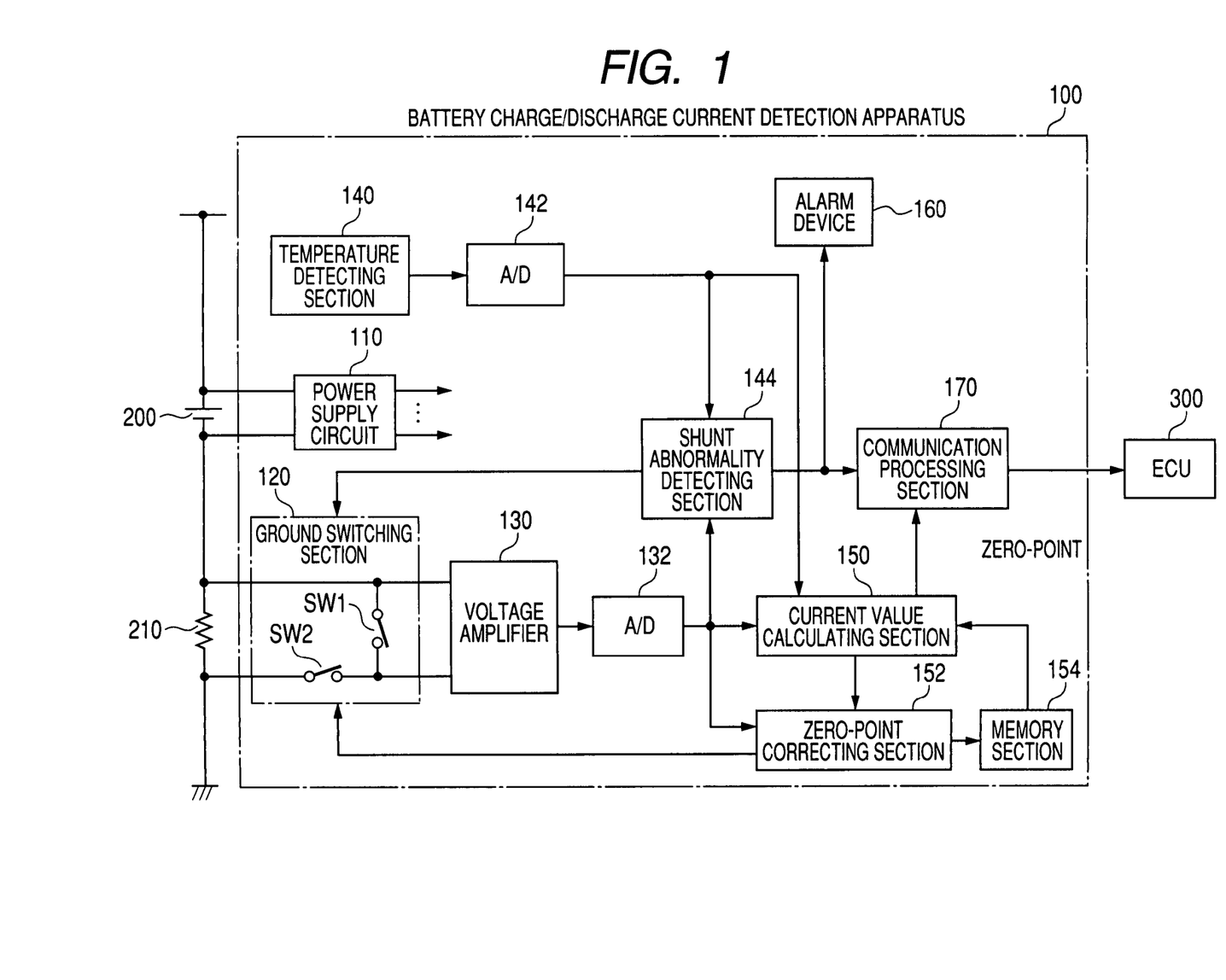
FIG. 1 is a functional block diagram of a battery charge/discharge current detection apparatus according to an embodiment of the invention.

FIG. 1 is a functional block diagram of a battery charge/discharge current detection apparatus 100 according to an embodiment of the invention. The battery charge/discharge current detection apparatus 100 detects the charge/discharge current of a vehicle battery 200 on the basis of the voltage (a shunt voltage) appearing across both ends of a shunt resistor (a voltage detecting resistor) 210 connected between the negative terminal of the battery 200 and the ground (a vehicle body, for example).

This battery charge/discharge current detection apparatus 100 includes a power supply circuit 110, a ground switching section 120, a voltage amplifier 130, A/D converters 132 and 142, a temperature detecting section 140, a shunt abnormality detecting section 144, a current value calculating section 150, a zero-point correcting section 152, a memory section 154, an alarm device 160, and a communication processing section 170.

The power supply circuit 110 generates an operating voltage to power each of the above components of the battery charge/discharge current detection apparatus 100.

The power supply circuit 110 has a battery-side positive terminal connected to the positive terminal of the battery 200 and a battery-side negative terminal connected to the negative terminal of the battery 200.

The ground switching section 120 is parallel-connected to the shunt resistor 210 between the shunt resistor 210 and the voltage amplifier 130. The ground switching section 120 is constituted by switches SW1 and SW2. To apply the voltage appearing across both ends of the shunt resistor 120 to the voltage amplifier 130, the switch SW2 is turned on and the switch SW1 is turned off.

To perform a zero-point correction, the switch SW1 is turned on, and the switch SW2 is turned off. By turning on both the switch SW1 and the switch SW2, it is possible to use the ground switching section 120 as a bypass of the shunt resistor 120.

The voltage amplifier 130 amplifies the shunt voltage appearing across the shunt resistor 210.

The amplified shunt voltage is converted into digital data (shunt voltage data) by the A/D converter 132.

The temperature detecting section 140 detects the temperature of the shunt resistor 210.

The voltage representing the temperature of the shunt resistor 210 outputted from the temperature detecting circuit 140 is converted into digital data (shunt temperature data) by the A/D converter 142.

The shunt abnormality detecting section 144 detects an abnormality of the shunt resistor 210 on the basis of the shunt voltage data and the shunt temperature data. The current value calculating section 150 calculates the charge/discharge current of the battery 200 (or the current flowing through the shunt resistor 210) on the basis of the shunt voltage data. The current value calculating section 150 also performs a processing to compensate for variation of the resistance of the shunt resistor 210 due to temperature variation of the shunt resistor 210.

The zero-point correcting section 152 performs the zero-point correction processing after switching the connection state of the switches SW1 and SW2 as above.

The result of the processing is stored in the memory section 154.

When the shunt abnormality detecting section 144 detects an abnormality of the shunt resistor 210, the alarm device 160 indicates to the outside the detection result. The communication processing section 170 transmits through a communication line the detection result that the shunt resistor 210 is abnormal to the ECU 300 operating as an external control device.

Figure 2:
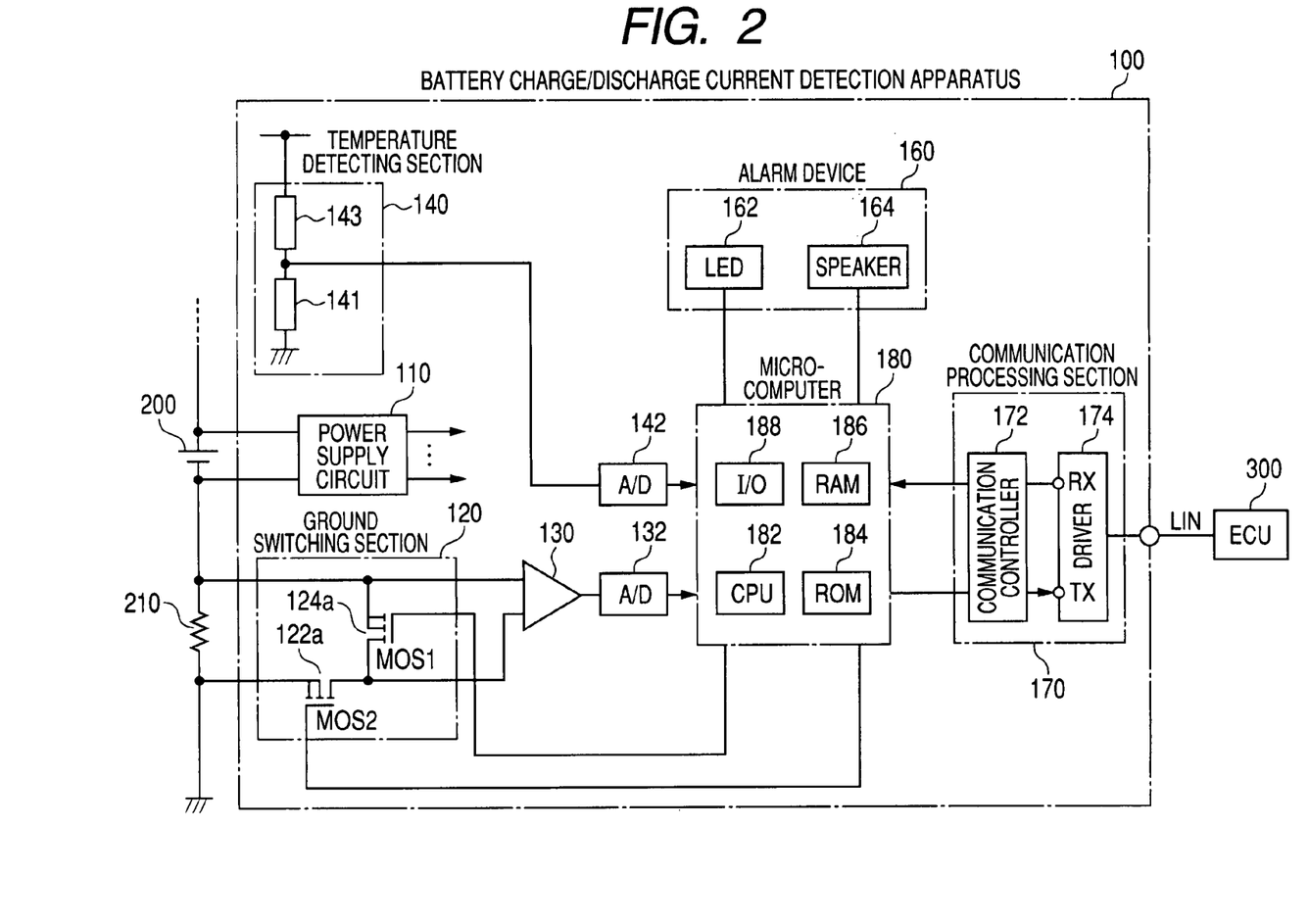
FIG. 2 is a diagram showing in more detail the structure of the battery charge/discharge current detection apparatus shown in FIG. 1.

FIG. 2 is a diagram showing in more detail the structure of the battery charge/discharge current detection apparatus 100 in a case where battery charge/discharge current detection apparatus 100 is constituted including a microcomputer. In the following, the structural correspondences between the functional blocks shown in FIG. 1 and the detailed blocks shown in FIG. 2 are explained.

(1) The switch SW1 and the switch SW2 of the ground switching section 120 are respectively constituted by a MOSFET (MOS1), and a MOSFET (MOS2). Each of the MOS1 and MOS 2 is turned on and off in accordance with a signal outputted from a microcomputer 180

(2) The temperature detecting circuit 140 includes a voltage dividing circuit constituted by a resistor 143 and a heat sensing element 141. The heat sensing element 141, which is an element whose resistance varies with the temperature thereof, is thermally connected to the shunt resistor 210 directly or through a circuit board. When the temperature of the shunt resistor 210 rises, and accordingly, the temperature of the heat sensing element 141 rises, the resistance of the heat sensing element 141 increases, as a result of which the value of the shunt temperature data outputted from the A/D converter 142 increases.

(3) The alarm device 160 includes an LED 162 and a speaker 164. The LED 162 is for visually indicating occurrence of an abnormality. The speaker 164 is for audibly indicating occurrence of an abnormality.

(4) The communication processing section 170 includes a communication controller 172 and a driver 174. The communication controller 172 transforms a shunt abnormality signal outputted from the microcomputer 180 when the shunt resistor 210 becomes abnormal into a signal having a predetermined format, and then modulates this transformed signal. The modulated signal (digital modulated signal) is transmitted from the driver 174 to the ECU 300 through the communication line.

(5) The microcomputer 180 includes a CPU 182, a ROM 184, a RAM 186, and an I/O device 188. The operations of the shunt abnormality detecting section 144, current value calculating section 150, and zero-point correcting section 152 shown in FIG. 1 are implemented by executing predetermined operation programs stored in the ROM 184 by the CPU 182. The RAM 186 is used as the memory section 154. The operations of the shunt abnormality detecting section 144, current value calculating section 150, and zero-point correcting section 152 may be implemented by dedicated logic circuits instead of the microcomputer 180.

The voltage amplifier 130 may include two amplifiers, one is for amplifying the shunt voltage when it is positive, and one is for amplifying the shunt voltage when it is negative. Alternatively, means for applying a bias voltage to the shunt voltage in order that it becomes absolutely positive (or negative) may be provided. In this case, the voltage amplifier 130 includes only a single amplifier, and the biased shunt voltage is amplified by this single amplifier of the voltage amplifier 130.

Figure 3:
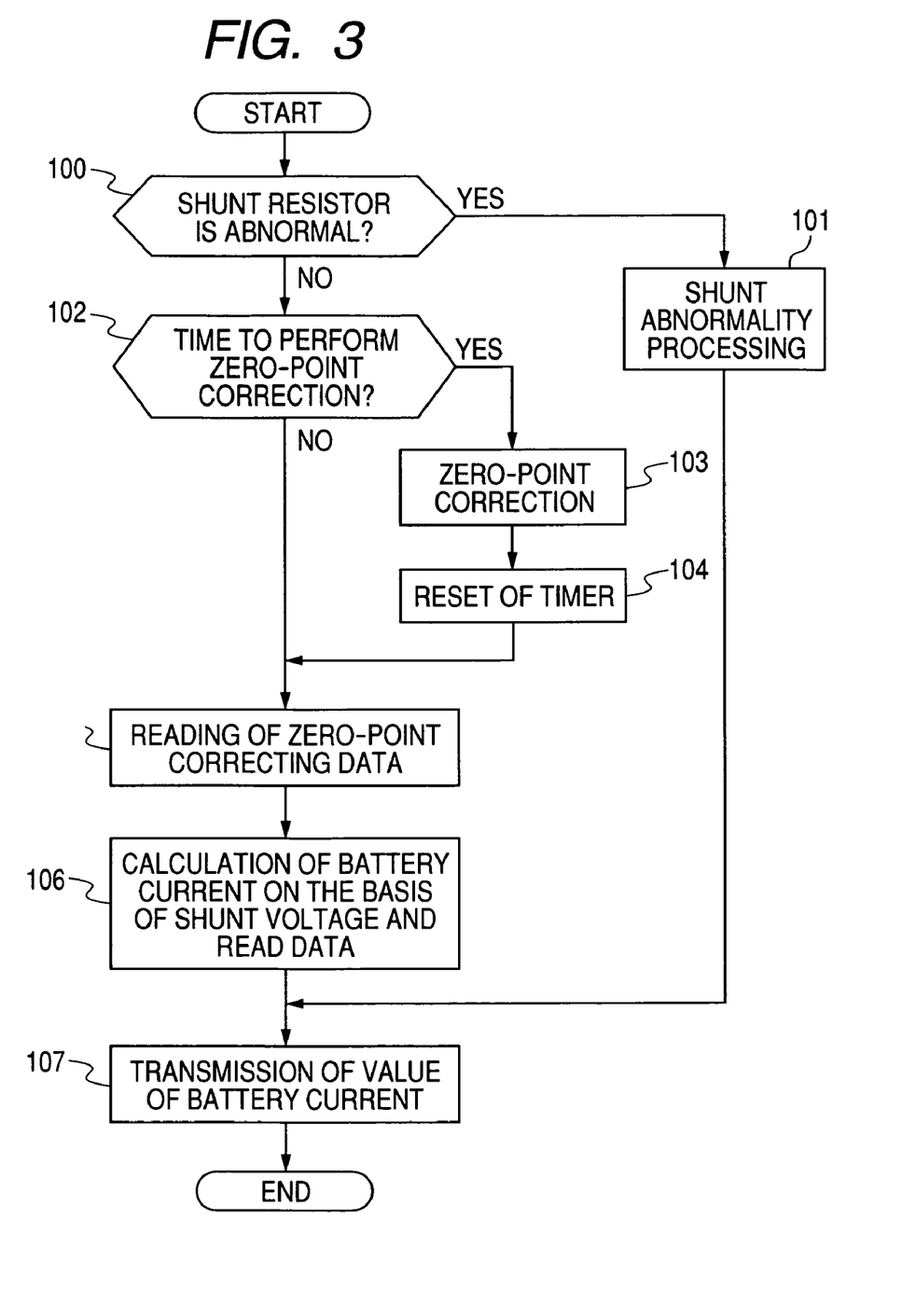
FIG. 3 is a flowchart showing a main operation flow of a current detection performed by the battery charge/discharge current detection apparatus shown in FIG. 1.

Next, the operation of the battery charge/discharge current detection apparatus 100 having the above described structure is explained. FIG. 3 is a flowchart showing a main operation flow of current detection performed by the battery charge/discharge current detection apparatus 100. The main operation flow is performed at regular time intervals (every 4 ms, for example). Alternatively, a part or the whole of the main operation flow may be performed at irregular intervals in response to interrupt requests.

The main operation flow begins by determining whether or not there is an abnormality in the shunt resistor 210 at step S100. If the determination result at step S100 is affirmative, the flow proceeds to step S101 where the shunt abnormality detecting section 144 sends an instruction to the ground switching section 120 to perform a shunt-abnormality processing.

If the determination result at step S100 is negative, the flow proceeds to step S102 where the zero-point correcting section 152 determines whether or not it is time to perform the zero-point correction. For example, assuming that the zero-point correction is performed at three-second intervals, and the intervals are monitored by use of a timer, the determination at step S102 can be made by detecting a time-up signal which the timer issues after an elapse of three-second period since the start of the timer. If the determination result at step S102 is positive, the flow proceeds to step S103 where the zero-point correcting section 152 performs the zero-point collection processing, and then the flow proceeds to step S104 to reset the timer.

After the timer is reset at step S104, or if the determination result at step S102 is negative, the flow proceeds to step S105 where the current value calculating section 150 reads data needed for performing the zero-point correction processing from the memory section 154, and then the flow proceeds to step S106 to calculate the charge/discharge current (battery current) of the battery 200 on the basis of the shunt voltage. Thereafter, the calculated value of the battery current is transmitted from the communication processing section 170 to the ECU 300 at step S107 to end this flow.

Figure 4:
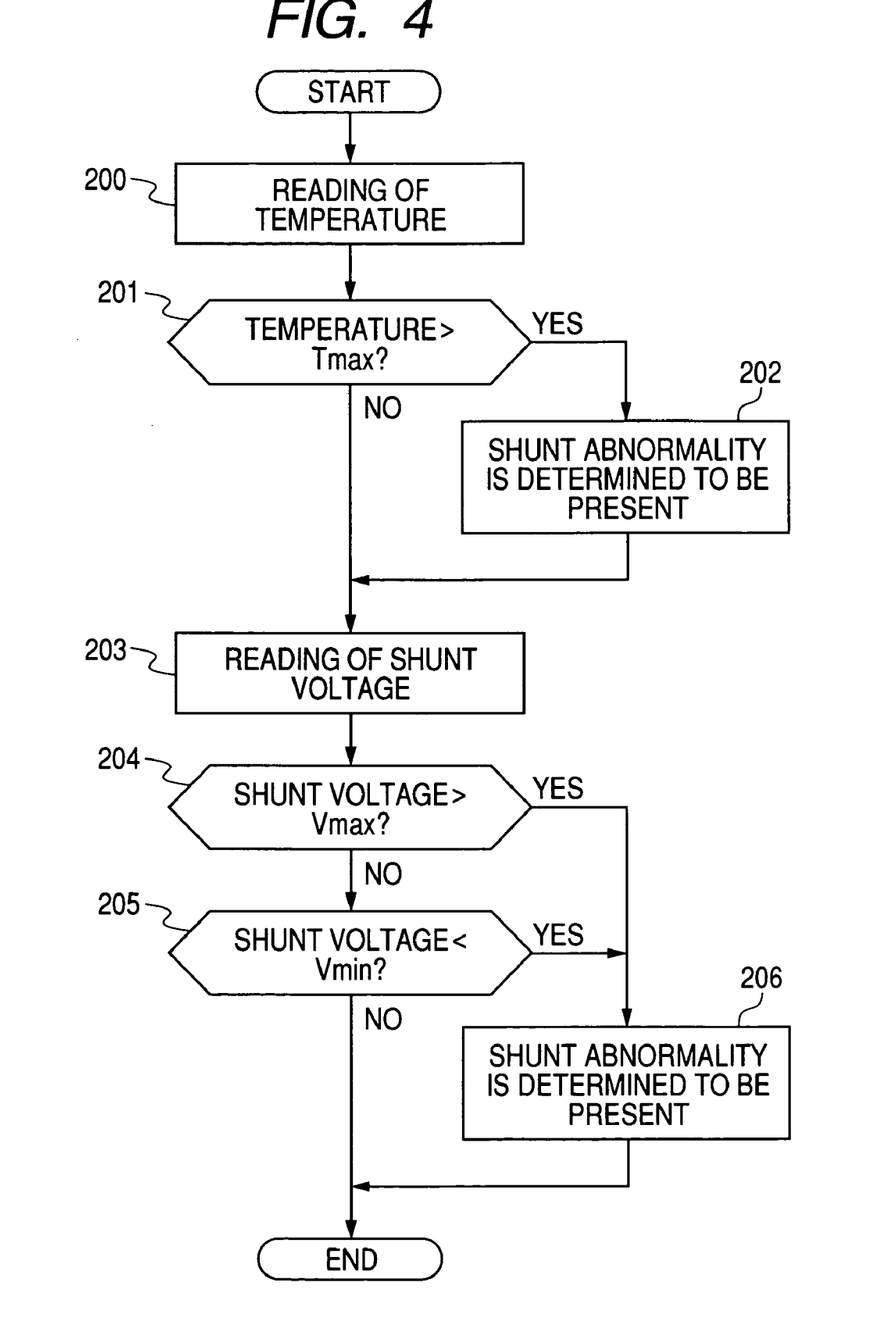
FIG. 4 is a flowchart showing a specific example of a procedure performed at step S100 shown in FIG. 3 for determining whether or not there is an abnormality in a shunt resistor.

FIG. 4 is a flowchart showing a specific example of the procedure performed at step S100 shown in FIG. 3 for determining whether or not there is an abnormality in the shunt resistor 210. As shown in FIG. 4, in this example, the shunt abnormality detecting section 144 reads the shunt temperature data outputted from the A/D converter 142 at first step S200. Subsequently, it is determined at step S201 whether or not the temperature of the shunt resistor 210 is above an upper allowable limit Tmax on the basis of the read shunt temperature data. If the determination result at step S201 is affirmative, a shunt-abnormality determination is made at step S202.

The shunt abnormality detecting section 144 also reads the shunt voltage data outputted from the A/D converter 132 at step S203. Subsequently, it is determined at step S204 whether or not the shunt voltage is above an upper allowable limit Vmax, and determined at step S205 whether or not the shunt voltage is below a lower allowable limit Vmin. If the determination result at any one of step S204 and step S205 is affirmative, a shunt-abnormality determination is made at step S206.

Figure 5:
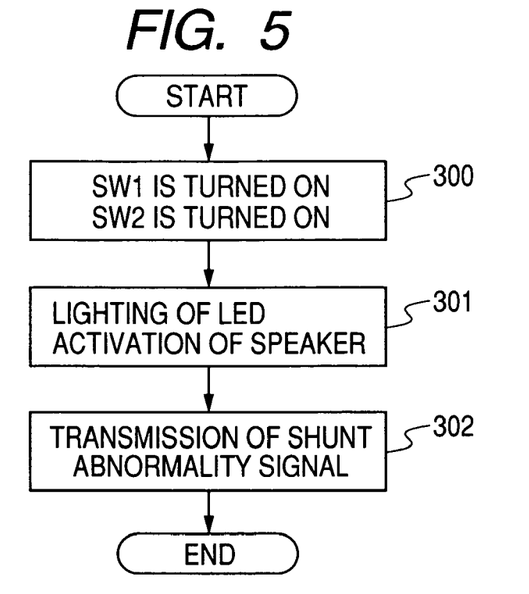
FIG. 5 is a flowchart showing a specific example of a shunt abnormality processing performed at step S101 shown in FIG. 3.

FIG. 5 is a flowchart showing a specific example of the shunt abnormality processing performed at step S101 shown in FIG. 3. As shown in FIG. 5, in this example, the shunt abnormality detecting section 144 sends at first step S300 an instruction to the ground switching section 120 to switch the connection state of the round switching section 120. In more detail, the switch SW1 and the switch SW2, which are respectively in the off state and on state during battery current detection, are both set to the on state. Thereafter, the alarm device 160 lights the LED 162, and activates the speaker 164 to emit an alarm sound at step S301. Subsequently, the communication processing section 170 transmits the shunt abnormality signal to the ECU 300 at step S302.

Figure 6:
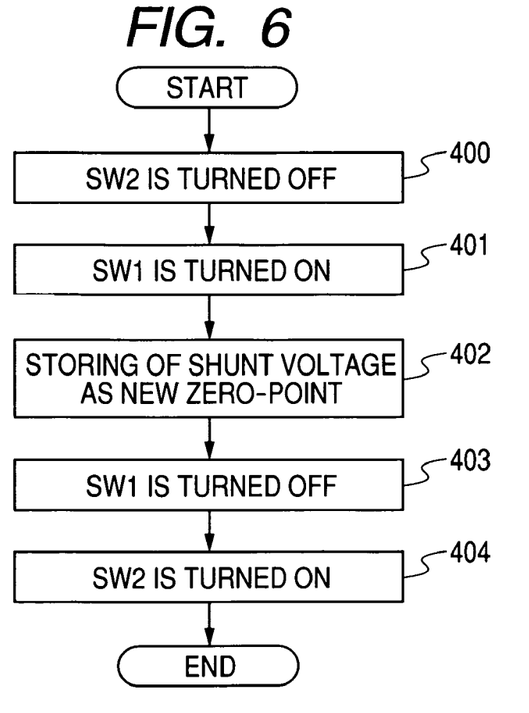
FIG. 6 is a flowchart showing a specific example of a zero-point correction processing performed at step S103 shown in FIG. 3.

FIG. 6 is a flowchart showing a specific example of the zero-point correction processing performed at step S103 shown in FIG. 3. In this example, the zero-point correcting section 152 sends an instruction to turn off the switch SW2 and turn on the switch SW1 to the ground switching section 120 at steps S401 and S402. As a result, since the input terminals of the voltage amplifier 130 are short-circuited through the switch SW1, there is produced a virtual state where the current flowing through the shunt resistor is 0 A, and the shunt voltage is 0 V.

The zero-point correcting section 152 stores the shunt voltage when the above connection state is produced in the memory section 154 as a zero-point. Thereafter, the zero-point correcting section 152 sends an instruction to turn off the switch SW1 and turn on the switch SW2 to the ground switching section 120 at steps S403 and S404. The current value calculating section 150 obtains the shunt voltage after being subjected to the zero-point correction by subtracting the shunt voltage stored in the memory section 154 as a zero-point from the actually measured shunt voltage, in order to accurately calculate a shunt current.

The battery charge/discharge current detection apparatus 100 of this embodiment described above provides the following advantages. As explained above, in the battery charge/discharge current detection apparatus 100 of this embodiment, the battery-side negative terminal of the power supply circuit 110 is not connected to the ground to which one terminal of the shunt resistor 210 is connected, but to the negative terminal of the battery 200. This makes it possible to remove the effect of variation of voltage drop across the shunt resistor 210 when a large electrical load consuming large power such as a starter motor or a power steering is operated, and as a result, the operation of the battery charge/discharge current detection apparatus 100 is stabilized to thereby improve the current detection accuracy. When an abnormality of the shunt resistor 210 is detected, it is indicated to the outside. This makes it possible to take quickly an appropriate measure, for example reducing the load current, or repairing or replacing the shunt resistor 210.

The shunt abnormality detecting section 144 performs the abnormality detecting operation on the basis of the shunt voltage. Accordingly, when the shunt voltage is detected to be outside a predetermined normal range, it can be definitely determined that there is an abnormality in the shunt resistor 210. Since the shunt voltage is used to detect the charge/discharge current of the battery 200, any specific component is not required to detect an abnormality of the shunt resistor 210.

The shunt abnormality detecting section 144 performs the abnormality detecting operation on the basis of the shunt temperature detected by the temperature detecting section 140. This makes it possible to detect an abnormality that the resistance of the shunt resistor 210 becomes excessively large, and the heat emitted from the shunt resistor 210 becomes excessively large. By detecting the temperature of the shunt resistor 210, it becomes possible to perform temperature compensation in accordance with a pre-measured relationship between the resistance of the shunt resistor 210 and the temperature of the shunt resistor 210 to improve the current detecting accuracy. Particularly, by detecting the shunt temperature by use of the heat sensing element 141 thermally connected to the current detecting resistor, an abnormality of the shunt resistor 210 can be reliably detected. By thermally connecting the shunt resistor 210 to the negative terminal of the battery 200, it becomes possible to detect an abnormality of the battery 200, because the temperature of the battery 200 can be detected.

The provision of the ground switching section 120 capable of forming a bypass of the shunt resistor 210 when an abnormality is detected in the shunt resistor 210 makes it possible to prevent the battery charge/discharge current detection apparatus 100 from completely floating from the ground even if the resistance of the shunt resistor 210 becomes abnormally large, or the shunt resistor 210 is blown.

By connecting the ground switching section 120 in parallel to the shunt resistor 210 as a bypass, it becomes possible to virtually bring the voltage across the shunt resistor 210 to 0 V, that is, to virtually produce a state where no current flows through the shunt resistor 210. By performing the zero-point correction in this state, the current detecting accuracy can be improved.

It is a matter of course that various modifications can be made to the above described embodiment as described below for example. In the above embodiment, to prevent the battery charge/discharge current detection apparatus 100 from floating from the ground when an abnormality occurs in the shunt resistor 210, the connection state of the ground switching section 120 is switched (step S300 in FIG. 5). However, preventing the battery charge/discharge current detection apparatus 100 from floating from the ground may be achieved by different methods.

Figure 7:
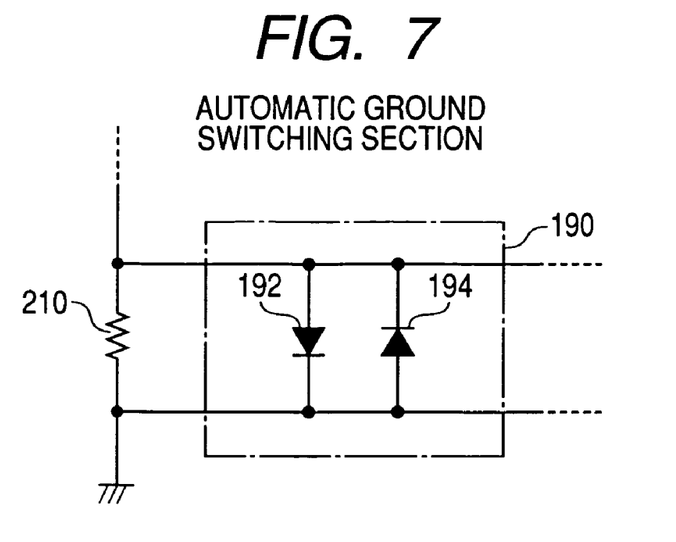
FIG. 7 is a diagram showing an alternative of a ground switching section included in the battery charge/discharge current detection apparatus shown in FIG. 1.

FIG. 7 is a diagram for explaining one of such methods. An automatic ground switching section 190 shown in FIG. 7 includes a first and second diodes 192 and 194 parallel-connected to the shunt resistor 210 in opposite polarity directions. Even when an abnormality occurs in the shunt resistor 210, and as a result, the voltage across the shunt resistor 210 becomes larger than the forward voltage drop of the first diode 192 (including the case where the shunt resistor is blown), it is possible to pass a current between the battery 200 and the ground through the first diode 192. Accordingly, the battery charge/discharge current detection apparatus 100 can be prevented from completely floating from the ground, to thereby ensure communication with the ECU 300 irrespective of presence of an abnormality in the shunt resistor 210. By using the first and second diodes 192 and 194 as power elements capable of passing the charge/discharge current of the battery 200, it becomes possible for the battery 200 to continue its charge/discharge operation even when an abnormality occurs in the shunt resistor 210. The structure shown in FIG. 7 may be used along with the ground switching section 120 shown in FIG. 1, or may replace the ground switching section 120.

In the above embodiment, the shunt abnormality processing (step S101 in FIG. 3) switches the connection state of the ground switching section 120 (step S300 in FIG. 5) without exception, however, the switching may be performed only when necessary.

Figure 8:
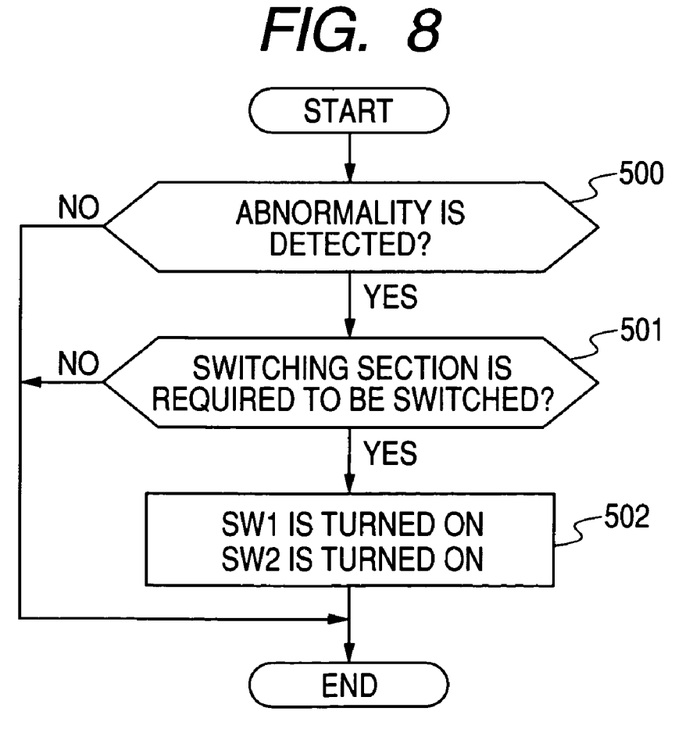
FIG. 8 is a flowchart showing a flow of a modification of the shunt abnormality processing in which switching of the connection state of the ground switching section is performed only when necessary.

FIG. 8 is a flowchart showing a flow of a modification of the shunt abnormality processing in which switching of the connection state of the ground switching section 120 is performed only when necessary. In the flowchart of FIG. 8, to emphasize the procedure of switching the connection state of the ground switching section 120, the processing of indicating an abnormality occurred in the shunt resistor 210 and the processing of transmitting the occurrence of the shunt abnormality are omitted.

When an abnormality occurs (YES in step S500), the shunt abnormality detecting section 144 determines whether or not it is necessary to switch the connection state of the ground switching section 120 at step S501. For example, in a case where although the shunt resistor 210 is determined to be abnormal on the basis of the shunt temperature, the resistance of the shunt resistor 210 or the shunt voltage is within a normal range, or a case where the shunt resistor 210 is short-circuited causing the shunt voltage to fall below a normal range, it is not necessary to switch the connection state of the ground switching section 120 though the shunt resistor 210 is abnormal. On the other hand, in a case where the shunt voltage increases above the normal range, or a case where the shunt voltage varies heavily and does not become stable, an affirmative determination is made at step S501. As a result, the connection state of the ground switching section 120 is switched at step S502.

In the above embodiment, communication between the battery charge/discharge current detection apparatus 100 and the ECU 300 is performed through the communication line, however the communication may be performed without through any communication line. For example, the driver 174 shown in FIG. 2 may be replaced by a radio driver, or an infrared driver. In this case, when the resistance of the shunt resistor 210 becomes abnormally large, and as a result, the shunt resistor 210 is blown, it is possible to inform the ECU 300 of the abnormality of the shunt resistor 210 irrespective of whether or not the battery charge/discharge current detection apparatus 100 is floating from the ground. It is needless to say that the ECU 300 has to be provided with a radio or infrared receiver in this case.

The above explained preferred embodiments are exemplary of the invention of the present application which is described solely by the claims appended below. It should be understood that modifications of the preferred embodiments may be made as would occur to one of skill in the art.

What is claimed is:

1. A battery charge/discharge current detection apparatus having a power supply circuit powered by a battery mounted on a vehicle and configured to detect a charge/discharge current of the battery by use of a current detecting resistor connected between a negative terminal of the battery and a ground, the battery charge/discharge current detection apparatus comprising:
   a first function of detecting a voltage across the current detecting resistor;
   a second function of detecting a charge/discharge current of the battery on the basis of the voltage detected by the first function;
   a third function of detecting presence of an abnormality of the current detecting resistor;
   a fourth function of informing the abnormality detected by the third function to the outside;
   a fifth function of forming a bypass of the current detecting resistor when the third function detects the abnormality of the current detecting resistor; and
   a sixth function of producing a state where the voltage across the current detecting resistor is virtually zero, and performing a zero-point correction for the second function in the produced state;
   wherein a battery-side negative terminal of the power supply circuit is connected to the negative terminal of the battery.

2. A battery charge/discharge current detection apparatus having a power supply circuit powered by a battery mounted on a vehicle and configured to detect a charge/discharge current of the battery by use of a current detecting resistor connected between a negative terminal of the battery and a ground, the battery charge/discharge current detection apparatus comprising:
   a first function of detecting a voltage across the current detecting resistor;
   a second function of detecting a charge/discharge current of the battery on the basis of the voltage detected by the first function;
   a third function of detecting presence of an abnormality of the current detecting resistor;
   a fourth function of informing the abnormality detected by the third function to the outside;
   a fifth function of forming a bypass of the current detecting resistor when the third function detects the abnormality of the current detecting resistor; and
   a sixth function of producing a state where the voltage across the current detecting resistor is virtually zero;
   wherein a battery-side negative terminal of the power supply circuit is connected to the negative terminal of the battery.

* * * * *